United States Patent
Sohn

(10) Patent No.: US 7,652,530 B2
(45) Date of Patent: Jan. 26, 2010

(54) AMPLIFIER CIRCUIT AND METHOD OF GENERATING BIAS VOLTAGE IN AMPLIFIER CIRCUIT

(75) Inventor: Young-soo Sohn, Gunpo-si (KR)

(73) Assignee: Samsung Electronics Co., Ltd. (KR)

( * ) Notice: Subject to any disclaimer, the term of this patent is extended or adjusted under 35 U.S.C. 154(b) by 82 days.

(21) Appl. No.: 11/899,511

(22) Filed: Sep. 6, 2007

(65) Prior Publication Data

US 2008/0094136 A1 Apr. 24, 2008

(30) Foreign Application Priority Data

Oct. 18, 2006 (KR) .................. 10-2006-0101558

(51) Int. Cl.
*H03F 1/14* (2006.01)
*H03F 3/45* (2006.01)

(52) U.S. Cl. .......................... 330/51; 330/261

(58) Field of Classification Search ............ 330/51, 330/261

See application file for complete search history.

(56) References Cited

U.S. PATENT DOCUMENTS

| 5,973,558 | A | * | 10/1999 | Date et al. ................ 330/51 |
| 6,040,730 | A | | 3/2000 | Ferrario |
| 6,559,719 | B2 | | 5/2003 | Sakuragi |
| 2002/0075070 | A1 | | 6/2002 | Sakuragi |

FOREIGN PATENT DOCUMENTS

| JP | 06-164315 | 6/1994 |
| JP | 09-162654 | 6/1997 |
| JP | 11-41039 | 2/1999 |
| JP | 2002-185260 | 6/2002 |

\* cited by examiner

*Primary Examiner*—Steven J Mottola
(74) *Attorney, Agent, or Firm*—Mills & Onello, LLP

(57) ABSTRACT

Provided are a differential amplifier circuit and a method of generating a bias voltage in a differential amplifier circuit. The differential amplifier circuit is turned on or turned off in response to an input voltage and includes a differential amplifier and a bias circuit. The bias circuit provides a first bias voltage to a gate of a pull-down transistor included in the differential amplifier when the differential amplifier is turned on and provides second bias voltage which is lower than the first bias voltage to the gate of the pull-down transistor when the differential amplifier is turned off.

20 Claims, 5 Drawing Sheets

AMPLIFIER CIRCUIT AND METHOD OF GENERATING BIAS VOLTAGE IN AMPLIFIER CIRCUIT

CROSS-REFERENCE TO RELATED PATENT APPLICATION

This application claims priority under 35 U.S.C. §119 to Korean Patent Application No. 10-2006-0101558, filed on Oct. 18, 2006, in the Korean Intellectual Property Office, the disclosure of which is incorporated herein in its entirety by reference.

BACKGROUND OF THE INVENTION

1. Field of the Invention

The present disclosure relates to a semiconductor integrated circuit, and more particularly, to an amplifier circuit and a method of generating bias voltage in an amplifier circuit.

2. Description of the Related Art

Differential amplifier circuits are widely used in a semiconductor memory device such as dynamic random access memory (DRAM). The differential amplifier circuits amplify only a voltage difference between voltages applied to two input terminals. If the same voltage is applied to two input terminals, the output voltage of the differential amplifier circuits is not affected.

FIG. 1 is a circuit diagram of a conventional differential amplifier circuit 100. Referring to FIG. 1, the differential amplifier circuit 100 includes a bias circuit (or a bias voltage generating circuit) and a differential amplifier. The differential amplifier circuit 100 can be, for example, a data output driver of a semiconductor memory device.

The bias circuit includes a current source 105, an NMOS transistor 110 in a diode configuration, and a bias capacitor CB to prevent bias voltage noise from being generated in a bias node NB.

The NMOS transistor 110 performs as a voltage source. A terminal of the current source 105 is connected to a source voltage VDD, a source of the NMOS transistor 110 is connected to a ground voltage VSS, and a terminal of the bias capacitor CB is connected to the ground voltage VSS.

The differential amplifier includes load resistors R1 and R2 connected to the source voltage VDD, input NMOS transistors 115 and 120 respectively connected to first and second input voltages VIN1 and VIN2, and a bias transistor 125 including a source connected to the ground voltage VSS. The bias transistor 125 is an NMOS transistor and performs as a current source transistor.

The bias circuit provides constant bias voltage to a gate of the bias transistor 125 of the differential amplifier through the bias node NB.

The differential amplifier generates an output voltage VOUT through an output node NO by amplifying a voltage corresponding to the difference between the first and second input voltages VIN1 and VIN2. Levels of the first and second input voltages VIN1 and VIN2, respectively, input to the input NMOS transistors 115 and 120 of the differential amplifier can swing between the source voltage VDD and the ground voltage VSS.

A turn-on operation (or an activation operation) of the differential amplifier circuit 100 will now be described below.

The bias transistor 125 pulls down a voltage of a common node NC to the ground voltage VSS in response to a bias voltage generated in the bias node NB. When the first input voltage VIN1 is activated to a logic high level (for example, source voltage VDD) and the second input voltage VIN2 is at a logic low level (for example, the ground voltage VSS), the first input transistor 115 is turned on and the differential amplifier circuit 100 performs a turn-on operation. Thus, the output voltage VOUT, i.e., the voltage of the output node NO, is at a logic low level. A turn-off operation of the differential amplifier circuit 100 is performed when both of the first and second input voltages VIN1 and VIN2 are at a logic low level (for example, the ground voltage VSS).

Since current is provided to the common node NC through the load resistor R1 when the first input transistor 115 is turned on, a voltage of the common node NC can be higher than the ground voltage VSS. A voltage of the common node NC can increase a voltage of the bias node NB by parasitic coupling capacitance CC between the common node NC and the bias node NB. Noise corresponding to voltage rising of the bias node NB is referred to as "bias kick-back noise" or "kick-back noise." Since the bias transistor 125 is turned on strongly by the kick-back noise, a high electric current can flow through the bias transistor 125. Accordingly, power consumption of the differential amplifier circuit 100 increases. Also, noise such as a swing range change of the output voltage VOUT can occur due to the kick-back noise affecting voltage of the bias node NB.

FIG. 2 is a graph of bias voltage variation generated in the bias node NB of FIG. 1 versus time. That is, FIG. 2 indicates a voltage variation of the bias node NB of FIG. 1 in the turn-on and turn-off operations of the differential amplifier circuit 100 of FIG. 1.

Referring to FIGS. 1 and 2, at time TON when the first input transistor is turned on, the bias voltage is increased from a level of the constant bias voltage VB1 to a higher voltage than the voltage VB1 by the coupling capacitance. Noise corresponding to voltage rising of the bias voltage indicates the kick-back noise.

The following known approaches have been used to reduce the kick-back noise. The first approach is to increase the amount of current flowing through the NMOS transistor 110 of FIG. 1 by increasing the current amount of the current source 105 of FIG. 1. The second approach is to increase the size of the bias capacitor CB of FIG. 1. The third approach is to provide a counter coupling capacitance, which has opposite polarity to the coupling capacitance generated in the bias node NB of FIG. 1, to the bias node NB. However, the first approach can increase power consumption; the second approach can increase the total area of the differential amplifier circuit 100; and the third approach can also increase the total area of the differential amplifier circuit 100, since an extra circuit is required to generate the counter coupling capacitance provided to the bias node NB.

SUMMARY OF THE INVENTION

The present invention provides an amplifier circuit and a method of generating a bias voltage in an amplifier circuit, which can reduce kick-back noise.

According to an aspect of the present invention, there is provided a differential amplifier circuit which is configured to be turned on or turned off in response to an input voltage. The differential amplifier circuit includes a differential amplifier including a pull-down transistor; and a bias circuit configured to provide a first bias voltage to a gate of the pull-down transistor when the differential amplifier is turned on and is also configured to provide a second bias voltage which is lower than the first bias voltage to the gate of the pull-down transistor when the differential amplifier is turned off.

The bias circuit can include a current source configured to provide a current to a bias node connected to the gate of the pull-down transistor; a first NMOS transistor comprising a drain and a gate each connected to the bias node; a second NMOS transistor comprising a drain connected to a source of the first NMOS transistor, a gate configured to receive a bias control signal, which is activated to a logic high level when the differential amplifier is turned off, and a source connected to a ground voltage; and a third NMOS transistor comprising a drain and a gate each connected to the bias node, and the source connected to the ground voltage.

The bias circuit can further include a bias capacitor comprising a terminal connected to the bias node and other terminal connected to the ground voltage.

The bias circuit can include a first PMOS transistor comprising a source connected to a source voltage and a gate connected to a bias voltage; a second PMOS transistor comprising a source connected to a drain of the first PMOS transistor and a gate configured to receive a bias control signal, which is activated to a logic high level when the differential amplifier is turned off, a third PMOS transistor comprising a source connected to the source voltage, a gate connected to the bias voltage, and a drain connected to a drain of the second PMOS transistor and the gate of the pull-down transistor; and an NMOS transistor comprising a drain and a gate each connected to a bias node NB which is connected to the gate of the pull-down transistor, and a source connected to a ground voltage.

The bias circuit can further comprise a bias capacitor comprising a terminal connected to the bias node and another terminal connected to the ground voltage.

The differential amplifier can further comprise a plurality of input transistors each configured to receive a first input voltage activated when the differential amplifier is turned on and a second input voltage deactivated when the differential amplifier is turned on, wherein the input transistors are connected to the pull-down transistor through a common node.

The pull-down transistor can be configured to pull down an output voltage of the differential amplifier to a logic low level when the differential amplifier is turned on.

According to another aspect of the present invention, there is provided a differential amplifier circuit including first and second input transistors each configured to receive first and second input voltages; first and second load resistors each connected between each of the first and second input transistors, and a first voltage; a pull-down transistor connected between the first and second input transistors, and a second voltage, and configured to provide a pull-down current to the first input transistor and the first load resistor; and a bias circuit which provides a first bias voltage to a gate of the pull-down transistor when the first input voltage is activated and the second input voltage is deactivated, and configured to provide a second bias voltage which is lower than the first bias voltage to the gate of the pull-down transistor when the first input voltage and the second input voltage are deactivated.

The first voltage can be a source voltage and the second voltage is a ground voltage.

According to another aspect of the present invention, there is provided a single ended amplifier circuit configured to be turned on or turned off in response to an input voltage. The single ended amplifier circuit includes a single ended amplifier; and a bias circuit configured to provide a first bias voltage to a gate of a pull-down transistor included in the single ended amplifier when the single ended amplifier is turned on and to provide a second bias voltage which is lower than the first bias voltage to the gate of the pull-down transistor when the single ended amplifier is turned off.

The bias circuit can comprise a current source configured to provide a current to a bias node connected to the gate of the pull-down transistor; a first NMOS transistor comprising a drain and a gate each connected to the bias node; a second NMOS transistor comprising a drain connected to a source of the first NMOS transistor, a gate configured to receive a bias control signal, which is activated to a logic high level when the single ended amplifier is turned off, and a source connected to a ground voltage; and a third NMOS transistor comprising a drain and a gate each connected to the bias node, and a source connected to the ground voltage.

The bias circuit can further comprise a bias capacitor comprising a terminal connected to the bias node and another terminal connected to the ground voltage.

The bias circuit can comprise a first PMOS transistor comprising a source connected to a source voltage and a gate connected to a bias voltage; a second PMOS transistor comprising a source connected to a drain of the first PMOS transistor and a gate configured to receive a bias control signal, which is activated to a logic high level when the single ended amplifier is turned off; a third PMOS transistor comprising a source connected to the source voltage, a gate connected to the bias voltage, and a drain connected to a drain of the second PMOS transistor and the gate of the pull-down transistor; and an NMOS transistor comprising a drain and a gate each connected to a bias node NB which is connected to the gate of the pull-down transistor, and a source connected to a ground voltage.

The bias circuit can further comprise a bias capacitor comprising a terminal connected to the bias node and another terminal connected to the ground voltage.

The single ended amplifier can further comprise an input transistor configured to receive the input voltage activated when the single ended amplifier is turned on, and the input transistor is connected to the pull-down transistor through a pull-down node.

The pull-down transistor can be configured to pull down an output voltage of the single ended amplifier to a logic low level when the single ended amplifier is turned on.

According to another aspect of the present invention, there is provided a single ended amplifier circuit including an input transistor configured to receive an input voltage; a load resistor connected between the input transistor and a first voltage; a pull-down transistor connected between the input transistor and a second voltage, and configured to provide a pull-down current to the input transistor and the load resistor; and a bias circuit configured to provide a first bias voltage to a gate of the pull-down transistor when the input voltage is activated, and to provide a second bias voltage which is lower than the first bias voltage to the gate of the pull-down transistor when the input voltage is deactivated.

The first voltage can be a source voltage and the second voltage is a ground voltage.

According to another aspect of the present invention, there is provided a method of generating a bias voltage in a differential amplifier circuit configured to be turned on or turned off in response to an input voltage. The method includes generating and providing a first bias voltage to a gate of a pull-down transistor included in a differential amplifier of the differential amplifier circuit when the differential amplifier is turned on; and generating and providing a second bias voltage which is lower than the first bias voltage to the gate of the pull-down transistor when the differential amplifier is turned off.

According to another aspect of the present invention, there is provided a method of generating a bias voltage in a single ended amplifier circuit which is turned on or turned off in response to an input voltage. The method includes generating and providing a first bias voltage to a gate of a pull-down transistor included in a single ended amplifier of the single ended amplifier circuit when the single ended amplifier is turned on; and generating and providing a second bias voltage which is lower than the first bias voltage to the gate of the pull-down transistor when the single ended amplifier is turned off.

BRIEF DESCRIPTION OF THE DRAWINGS

Various aspects of the invention will become more apparent in view of the attached drawing figures, which are provided by way of example, not by way of limitation, wherein like elements are represented by like reference numerals, which are given by way of illustration only and thus do not limit the example embodiments of the present invention, in which.

DETAILED DESCRIPTION OF THE INVENTION

Hereinafter, various aspects and embodiments of the present invention will be described with reference to the attached drawings. The present invention can, however, be embodied in different forms and should not be constructed as limited to the embodiments set forth herein.

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is hot intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 3:
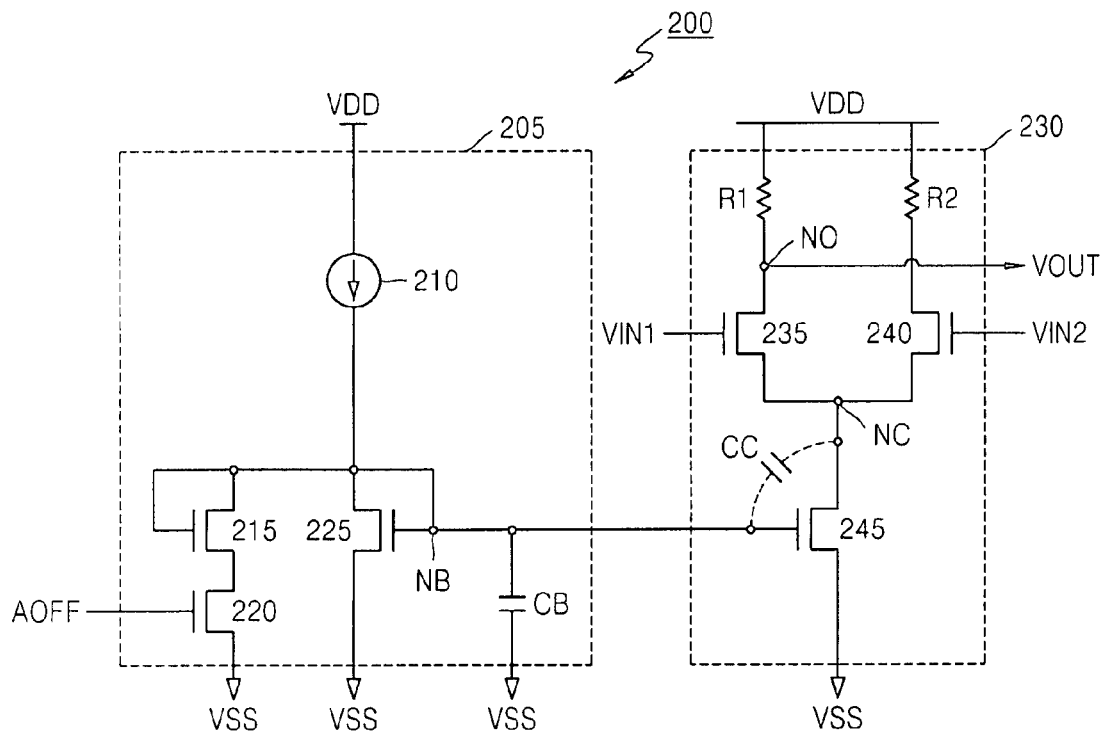
FIG. 3 is a circuit diagram of an embodiment of a differential amplifier circuit according to aspects of the present invention.

FIG. 3 is a circuit diagram of an embodiment of a differential amplifier circuit 200 according to an aspect of the present invention.

Referring to FIG. 3, the differential amplifier circuit 200 includes a bias circuit (or a bias voltage generating circuit) 205 and a differential amplifier 230. The differential amplifier circuit 200 can be, for example, a data output diver of a semiconductor memory device.

The bias circuit 205 includes a current source 210, first, second, and third NMOS transistors 215, 220, and 225, and a bias capacitor CB.

The current source 210 includes a terminal connected to a source voltage VDD and provides a current to a bias node NB. The bias node NB is connected to a gate of a pull-down transistor 245 of the differential amplifier 230.

The first NMOS transistor 215 has a diode configuration and performs as a voltage source transistor. The first NMOS transistor 215 includes a drain and a gate connected to the bias node NB.

The second NMOS transistor 220 performs as a switch transistor. The second NMOS transistor 220 includes a drain connected to a source of the first NMOS transistor 215, a gate to which a bias control signal AOFF is input from an external device, and a source connected to a ground voltage VSS. The bias control signal AOFF can be activated to a logic high level when the differential amplifier circuit 200 (or the differential amplifier 230) is turned off and be deactivated to a logic low level when the differential amplifier circuit 200 (or the differential amplifier 230) is turned on.

The third NMOS transistor 225 has a diode configuration and performs as a voltage source transistor. The third NMOS transistor 225 includes a drain and a gate respectively connected to the bias node NB, and a source connected to the ground voltage VSS.

The bias capacitor CB prevents bias voltage noise from being generated in the bias node NB. A terminal of the bias capacitor CB is connected to the bias node NB and other terminal of the bias capacitor CB is connected to the ground voltage VSS.

The differential amplifier 230 includes first and second load resistors R1 and R2, first and second input transistors 235 and 240, which respectively receive first and second input voltages VIN1 and VIN2, and a pull-down transistor 245 connected to the first and second input transistors 235 and 240 through a common node NC. Each of the first and second input transistors 235 and 240 can be, for example, an NMOS transistor.

The load resistors R1 and R2 are connected between a first voltage, which is the source voltage VDD, and each of the first and second input transistors 235 and 240.

The pull-down transistor 245 is connected between the first and second input transistors 235 and 240, and a second voltage, which is the ground voltage VSS, and provides a pull-down current to the first input transistor 235 and the first load resistor R1. The pull-down transistor 245 is a bias transistor, which can be an NMOS transistor, and performs as a current source transistor.

Figure 2:
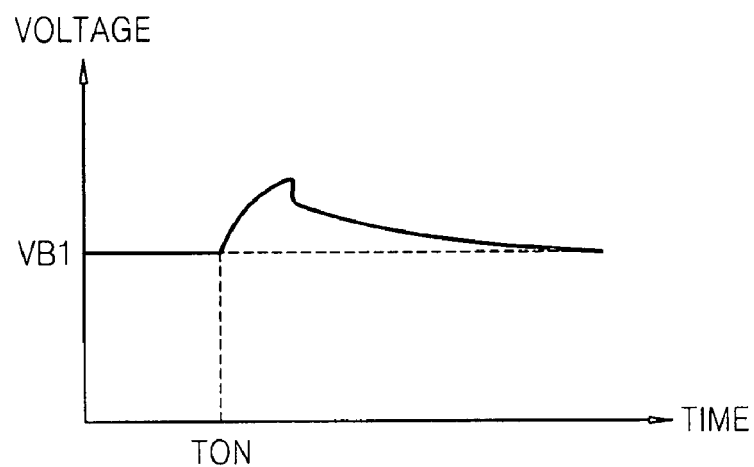
FIG. 2 is a graph of bias voltage variation generated in the bias node NB of FIG. 1 versus time.

The bias circuit 205 provides a substantially constant first bias voltage to a gate of the pull-down transistor 245 included in the differential amplifier 230 through the bias node NB when the differential amplifier 230 (or the differential amplifier circuit 200) is turned on. The bias circuit 205 also provides a second bias voltage, which is lower than the first bias voltage, to the gate of the pull-down transistor 245 included in the differential amplifier 230 through the bias node NB when the differential amplifier 230 (or the differential amplifier circuit 200) is turned off. The first bias voltage is required for the differential amplifier circuit 200 to perform the turn-on operation appropriately and is substantially equal to the voltage VB1 of FIG. 2.

The differential amplifier 230 generates an output voltage VOUT through an output node NO by amplifying a voltage corresponding to the difference between the first and second input voltages VIN1 and VIN2. Levels of the first and second input voltages VIN1 and VIN2, respectively, input to the first and second input transistors 235 and 240 of the differential amplifier 230 can swing between the source voltage VDD and the ground voltage VSS.

A turn-off operation (or a deactivation operation) of the differential amplifier circuit 200 will now be described below. The turn-off operation of the differential amplifier circuit 200 corresponds to a case when the first input voltage VIN1 is deactivated to a logic low level (for example, the ground voltage VSS) and the second input voltage VIN2 is also deactivated to a logic low level (for example, the ground voltage VSS). When the differential amplifier circuit 200 performs the turn-off operation, the output voltage VOUT is at a logic high level.

Since the first input voltage VIN1 is deactivated to a logic low level, the second NMOS transistor 220 of the bias circuit 205 is turned on in response to the bias control signal AOFF at a logic high level. Accordingly, a pull-down current flows through both the first NMOS transistor 215 and the third NMOS transistor 225 from the bias node NB to the ground voltage VSS. Therefore, the second bias voltage, which is the voltage of the bias node NB when the differential amplifier circuit 200 is turned off, is lower than the first bias voltage, which is the voltage of the bias node NB after the differential amplifier circuit 200 is turned on.

A turn-on operation (or an activation operation) of the differential amplifier circuit 200 will now be described below. The turn-on operation of the differential amplifier circuit 200 corresponds to a case when the first input voltage VIN1 is activated from a logic low level (for example, the ground voltage VSS) to a logic high level (for example, the source voltage VDD) and the second input voltage VIN2 is deactivated to a logic low level (for example, the ground voltage VSS). When the differential amplifier circuit 200 performs the turn-on operation, the first input transistor 235 is turned on by the first input voltage VIN1 at a logic high level. Accordingly, the output voltage VOUT of the output node NO is at a logic low level.

Since the first input voltage VIN1 transitions from a logic low level to a logic high level, the second NMOS transistor 220 of the bias circuit 205 is turned off in response to the bias control signal AOFF at a logic low level. Accordingly, a current does not flow through the first NMOS transistor 215 and a pull-down current flows only through the third NMOS transistor 225 from the bias node NB to the ground voltage VSS. As a result, a voltage of the bias node NB after the differential amplifier circuit 200 is turned on is the first bias voltage.

The initial operation of the turn-on operation of the differential amplifier circuit 200, that is, an operation when the first input voltage VIN1 transitions from a logic low level to a logic high level, will now be described below. The pull-down transistor 245 pulls down a voltage of the common node NC to the ground voltage VSS in response to the second bias voltage. In this case, the first input transistor 235 is turned on by the first input voltage VIN1 at a logic high level and a current is provided to the common node NC through the first load resistor R1 such that the voltage of the common node NC can be higher than the ground voltage VSS. The voltage of the common node NC can increase the voltage of the bias node NB by the parasitic coupling capacitance CC between the common node NC and the bias node NB. However, since the voltage of the bias node NB in the initial turn-on operation of the differential amplifier circuit 200 is set as the second bias voltage, which is a relatively low voltage, the voltage of the bias node NB can not be increased higher than the first bias voltage although kick-back noise is generated by the parasitic coupling capacitance CC. That is, the effect of the kick-back noise on the voltage of the bias node NB can be reduced. Accordingly, a high current does not flow through the pull-down transistor 245 due to the kick-back noise, unlike in the conventional differential amplifier circuits.

Since the differential amplifier circuit 200 can set the bias voltage when the differential amplifier 230 is turned off to be lower than the bias voltage when the differential amplifier 230 is turned on, the current that flows through the pull-down transistor 245 due to the kick-back noise can be reduced. Accordingly, the differential amplifier circuit 200 can reduce power consumption. Also, since the differential amplifier circuit 200 can set the bias voltage when the differential amplifier 230 is turned off to be lower than the bias voltage when the differential amplifier 230 is turned on, the effect of the kick-back noise on the voltage of the bias node NB can be reduced. As a result, the voltage of the bias node NB when the differential amplifier 230 is turned on can be maintained constant such that noise such as a swing change of the output voltage VOUT can be reduced.

Figure 4:
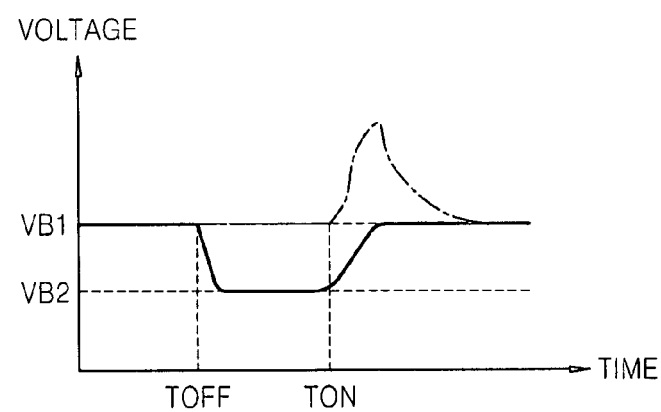
FIG. 4 is a graph of bias voltage variation generated in the bias node NB of the differential amplifier of FIG. 3 versus time.

FIG. 4 is a graph of bias voltage variation generated in the bias node NB of the differential amplifier circuit 200 of FIG. 3 versus time according to aspects of the present invention. That is, FIG. 4 indicates the voltage variation of the bias node NB of the differential amplifier circuit 200 of FIG. 3 in the turn-on and turn-off operations discussed above.

Referring to FIGS. 3 and 4, at time point TOFF, when the first input transistor 235 is turned off, the voltage of the bias node NB begins to decrease from the first bias voltage VB1 to the second bias voltage VB2. At time point TON, when the first input transistor 235 is turned on, the voltage of the bias node NB is not increased higher than the first bias voltage VB1, even though the voltage of the bias node NB is affected by kick-back noise (indicated by the dashed line in FIG. 4) and begins to increase from the second bias voltage VB2 to the first bias voltage VB1.

Figure 1:
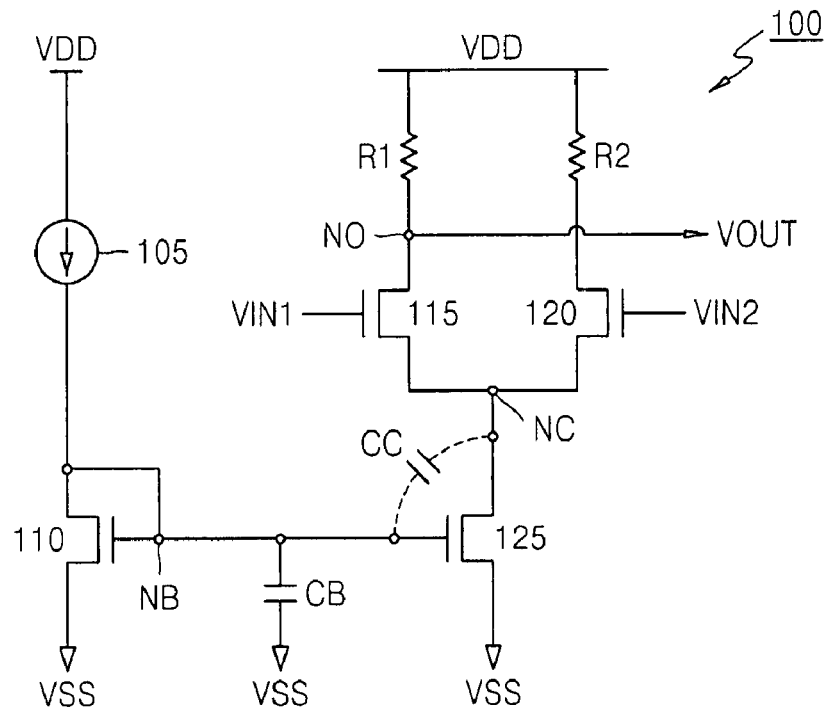
FIG. 1 is a circuit diagram of a conventional differential amplifier circuit 100.
Figure 5:
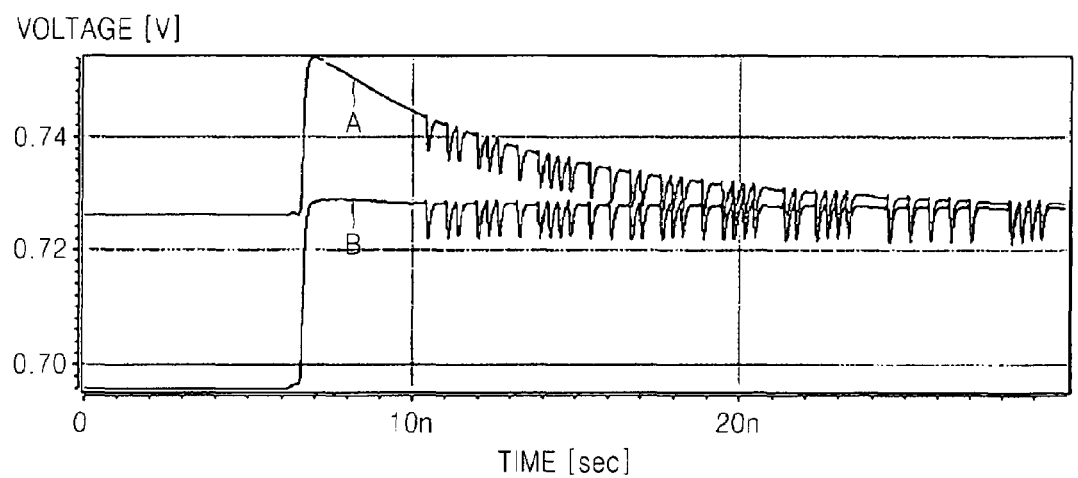
FIG. 5 is a graph illustrating a simulation result of voltage variation versus time in the bias node NB of the differential amplifier of FIG. 3 and another simulation result of voltage variation versus time in the bias node NB of the conventional differential amplifier of FIG. 1.

FIG. 5 is a graph illustrating a simulation result of voltage variation versus time in the bias node NB of the differential amplifier circuit 200 of FIG. 3 and another simulation result of voltage variation versus time in the bias node NB of the conventional differential amplifier circuit of FIG. 1.

Referring to FIG. 5, line "A" indicates a voltage variation versus time in the bias node NB of the conventional differential amplifier circuit of FIG. 1 and line "B" indicates a voltage variation versus time in the bias node NB of the differential amplifier circuit 200 of FIG. 3. It is assumed that the source voltage VDD is equal to about 1.2V in FIG. 5.

Referring to line A, the voltage in the bias node NB of the conventional differential amplifier circuit of FIG. 1 is increased to a predetermined voltage level by the kick-back noise and is then decreased to a constant voltage level. On the other hand, referring to line B, the voltage in the bias node NB of the differential amplifier circuit 200 of FIG. 3 has already decreased before the differential amplifier circuit 200 is turned on. Accordingly, the voltage of the bias node NB of the differential amplifier circuit 200 can be maintained substantially constant, even though the kick-back noise is generated by turning on the differential amplifier circuit 200 of FIG. 3.

Figure 6A:
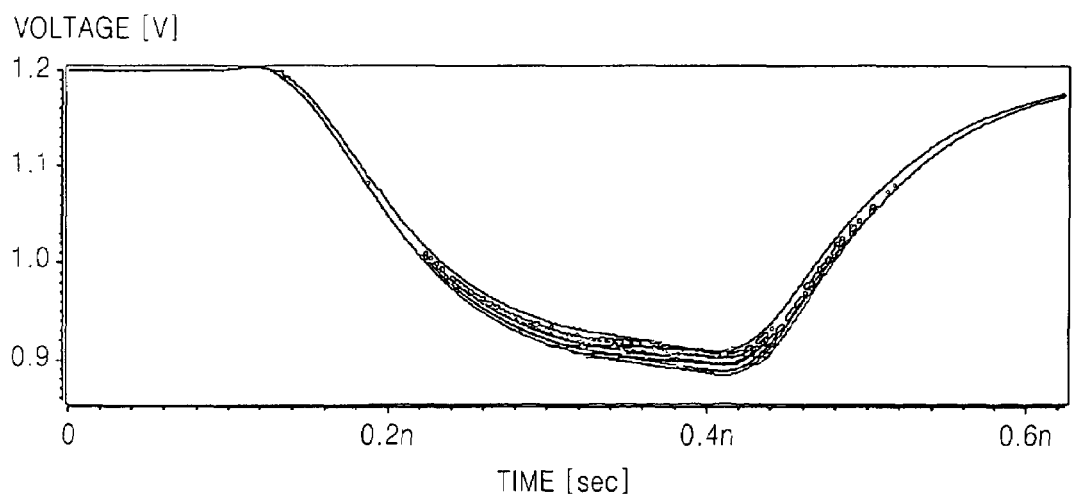
FIG. 6A is a graph illustrating a simulation result of voltage variation versus time in the output voltage VOUT of the conventional differential amplifier of FIG. 1.
Figure 6B:
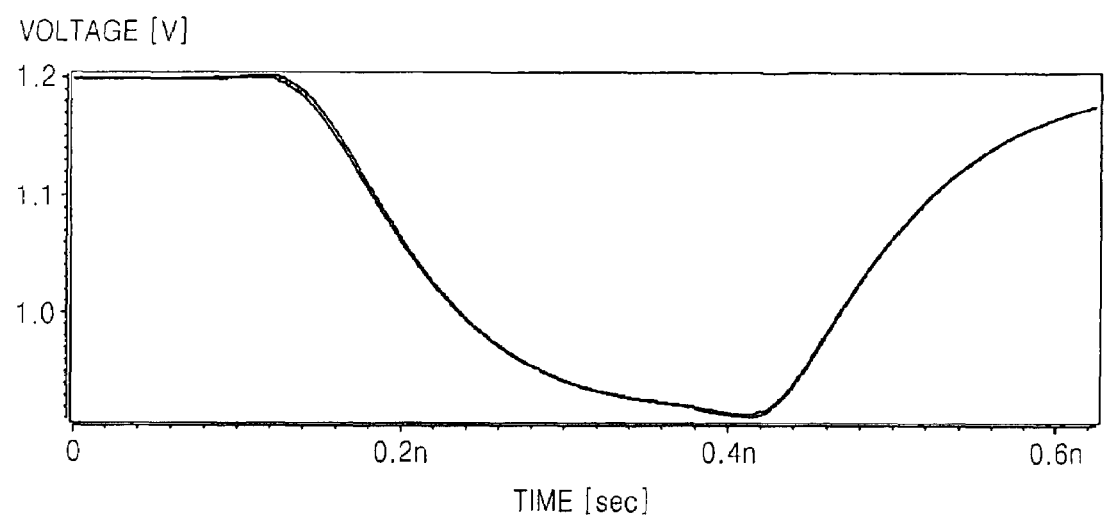
FIG. 6B is a graph illustrating a simulation result of voltage variation versus time in the output voltage VOUT of the differential amplifier of FIG. 3.

FIG. 6A is a graph illustrating a simulation result of voltage variation versus time in the output voltage VOUT of the conventional differential amplifier circuit of FIG. 1. FIG. 6B is a graph illustrating a simulation result of voltage variation versus time in the output voltage VOUT of the differential amplifier circuit 200 of FIG. 3. It is assumed that the source voltage VDD is equal to about 1.2V in FIGS. 6A and 6B.

Referring to FIG. 6A, a swing range of the output voltage VOUT is not constant and noise is generated in the output voltage VOUT by the noise of the bias node NB illustrated by line A in FIG. 5.

On the other hand, referring to FIG. 6B, a swing range of the output voltage VOUT is substantially constant and noise is not generated in the output voltage VOUT due to the substantially constant voltage of the bias node NB as illustrated by line B in FIG. 5.

Figure 7:
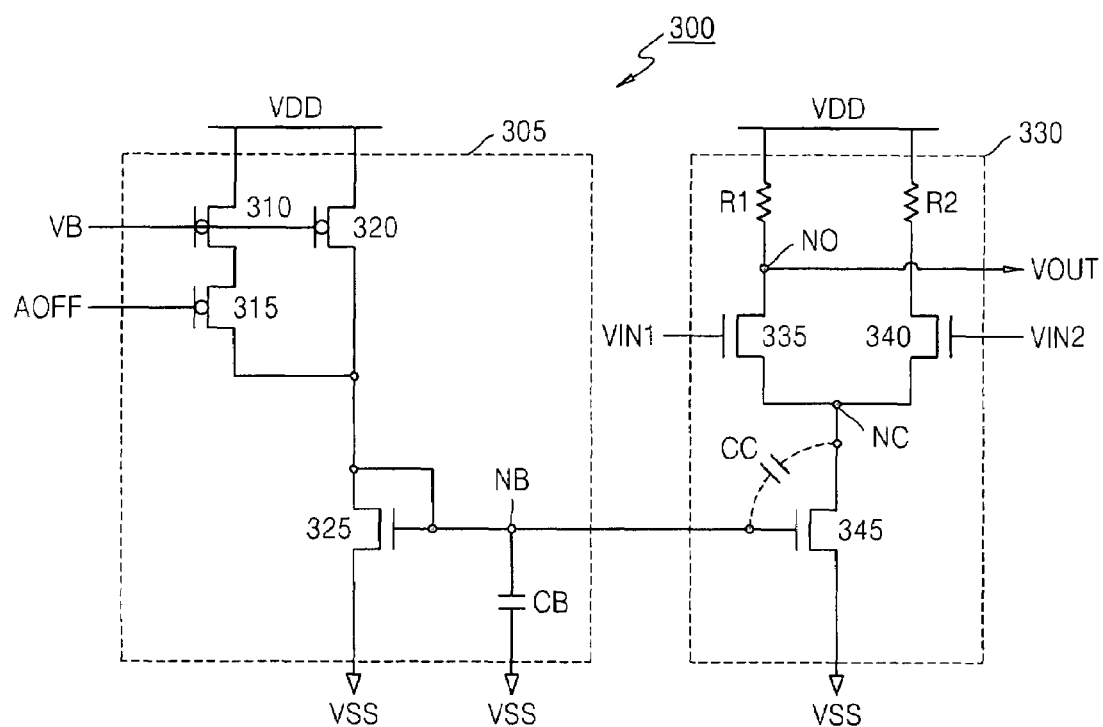
FIG. 7 is a circuit diagram of another embodiment of a differential amplifier circuit according to another aspect of the present invention.

FIG. 7 is a circuit diagram of an embodiment of a differential amplifier circuit 300 according to another aspect of the present invention.

Referring to FIG. 7, the differential amplifier circuit 300 includes a bias circuit (or a bias voltage generating circuit) 305 and a differential amplifier 330. The differential amplifier circuit 300 can be, for example, a data output diver of a semiconductor memory device.

The bias circuit 305 includes first, second, and third PMOS transistors 310, 315, and 320, respectively, an NMOS transistor 325, and a bias capacitor CB.

The first PMOS transistor 310 performs as a current source transistor. The first PMOS transistor 310 includes a source connected to a source voltage VDD and a gate connected to a bias voltage VB.

The second PMOS transistor 315 performs as a switch transistor. The second PMOS transistor 315 includes a source connected to a drain of the first PMOS transistor 310, and a gate to which a bias control signal AOFF is input from an external device. The bias control signal AOFF can be activated to a logic high level when the differential amplifier circuit 300 (or the differential amplifier 330) is turned off and can be deactivated to a logic low level when the differential amplifier circuit 300 (or the differential amplifier 330) is turned on.

The third PMOS transistor 320 performs as a current source transistor. The third PMOS transistor 320 includes a source connected to a source voltage VDD, a gate connected to the bias voltage VB, and a drain connected to the drain of the second PMOS transistor 315 and a gate of a pull-down transistor 345 of the differential amplifier 330.

The NMOS transistor 325 has a diode configuration and performs as a voltage source transistor. The NMOS transistor 325 includes a drain and a gate respectively connected to a bias node NB, and a source connected to a ground voltage VSS. The bias node NB is also connected to the gate of the pull-down transistor 345.

The bias capacitor CB prevents bias voltage noise from being generated in the bias node NB. A terminal of the bias capacitor CB is connected to the bias node NB and other terminal of the bias capacitor CB is connected to the ground voltage VSS.

The differential amplifier 330 includes first and second load resistors R1 and R2, first and second input transistors 335 and 340, which respectively receive first and second input voltages VIN1 and VIN2, and the pull-down transistor 345 connected to the first and second input transistors 335 and 340 through a common node NC. Each of the first and second input transistors 335 and 340 can be, for example, an NMOS transistor.

The load resistors R1 and R2 are connected between a first voltage, which is the source voltage VDD, and each of the first and second input transistors 335 and 340, respectively.

The pull-down transistor 345 is connected between the first and second input transistors 335 and 340, and a second voltage, which is a ground voltage VSS, and provides a pull-down current to the first input transistor 335 and the first load resistor R1. The pull-down transistor 345 is a bias transistor, which can be an NMOS transistor, and performs as a current source transistor.

The bias circuit 305 provides a constant first bias voltage to the gate of the pull-down transistor 345 included in the differential amplifier 330 through the bias node NB when the differential amplifier 330 (or the differential amplifier circuit 300) is turned on. The bias circuit 305 also provides a second bias voltage, which is lower than the first bias voltage, to the gate of the pull-down transistor 345 included in the differential amplifier 330 through the bias node NB when the differential amplifier 330 (or the differential amplifier circuit 300) is turned off. The first bias voltage is required for the differential amplifier circuit 300 to perform the turn-on operation appropriately and is substantially equal to the voltage VB1 of FIG. 2.

The differential amplifier 330 generates an output voltage VOUT though an output node NO by amplifying a voltage corresponding to the difference between the first and second input voltages VIN1 and VIN2. Levels of the first and second input voltages VIN1 and VIN2, respectively input to the first and second input transistors 335 and 340 of the differential amplifier 330, can swing between the source voltage VDD and the ground voltage VSS.

A turn-off operation of the differential amplifier circuit 300 will now be described below. The turn-off operation of the differential amplifier circuit 300 corresponds to a case when the first input voltage VIN1 is deactivated to a logic low level (for example, the ground voltage VSS) and the second input voltage VIN2 is also deactivated to a logic low level (for example, the ground voltage VSS). When the differential amplifier circuit 300 performs the turn-off operation, the output voltage VOUT is at a logic high level.

Since the first input voltage VIN1 is deactivated to a logic low level, the second PMOS transistor 315 of the bias circuit 305 is turned off in response to the bias control signal AOFF at a logic high level. Accordingly, no current flows through the first PMOS transistor 310 and current flows only through the third PMOS transistor 320 to the bias node NB. Therefore, the second bias voltage, which is the voltage of the bias node NB when the differential amplifier circuit 300 is turned off, is lower than the first bias voltage, which is the voltage of the bias node NB after the differential amplifier circuit 300 is turned on.

A turn-on operation of the differential amplifier circuit 300 will now be described below. The turn-on operation of the differential amplifier circuit 300 corresponds to a case when the first input voltage VIN1 is activated from a logic low level (for example, the ground voltage VSS) to a logic high level (for example, the source voltage VDD) and the second input voltage VIN2 is deactivated to a logic low level (for example, the ground voltage VSS). When the differential amplifier circuit 300 performs the turn-on operation, the first input transistor 335 is turned on by the first input voltage VIN1 at a logic high level. Accordingly, the output voltage VOUT of the output node NO is at a logic low level.

Since the first input voltage VIN1 transitions from a logic low level to a logic high level, the second PMOS transistor 315 of the bias circuit 305 is turned on in response to the bias control signal AOFF at a logic low level. Accordingly, current flows through both the first PMOS transistor 310 and the third PMOS transistor 320 to the bias node NB. As a result, a voltage of the bias node NB after the differential amplifier circuit 300 is turned on is the first bias voltage.

The initial operation of the turn-on operation of the differential amplifier circuit 300, that is an operation when the first input voltage VIN1 transitions from a logic low level to a logic high level, will now be described below. The pull-down transistor 345 pulls down a voltage of the common node NC to the ground voltage VSS in response to the second bias voltage. In this case, the first input transistor 335 is turned on by the first input voltage VIN1 at a logic high level and a current is provided to the common node NC through the first load resistor R1 such that a voltage of the common node NC can be higher than the ground voltage VSS. The voltage of the common node NC can increase the voltage of the bias node NB by the parasitic coupling capacitance CC between the common node NC and the bias node NB. However, since the voltage of the bias node NB in the initial turn-on operation of the differential amplifier circuit 300 is set as the second bias voltage, which is a relatively low voltage, a voltage of the bias node NB is not be increased higher than the first bias voltage, even though kick-back noise is generated by the parasitic coupling capacitance CC. That is, the effect of the kick-back noise on the voltage of the bias node NB can be reduced. Accordingly, a high current does not flow through the pull-down transistor 345 due to the kick-back noise, unlike in the conventional differential amplifier circuits.

Since the differential amplifier circuit 300 of FIG. 7 can set the bias voltage when the differential amplifier 330 is turned off to be lower than the bias voltage when the differential amplifier 330 is turned on, the current that flows through the pull-down transistor 345 due to the kick-back noise can be reduced. Accordingly, the differential amplifier circuit 300 can also reduce power consumption. Also, since the differential amplifier circuit 300 can set the bias voltage when the differential amplifier 330 is turned off to be lower than the bias voltage when the differential amplifier 330 is turned on, the effect of the kick-back noise on the voltage of the bias node NB can be reduced. As a result, the voltage of the bias node NB when the differential amplifier 330 is turned on can be maintained substantially constant such that noise, such as a swing range change of the output voltage VOUT, can be reduced.

Figure 8:
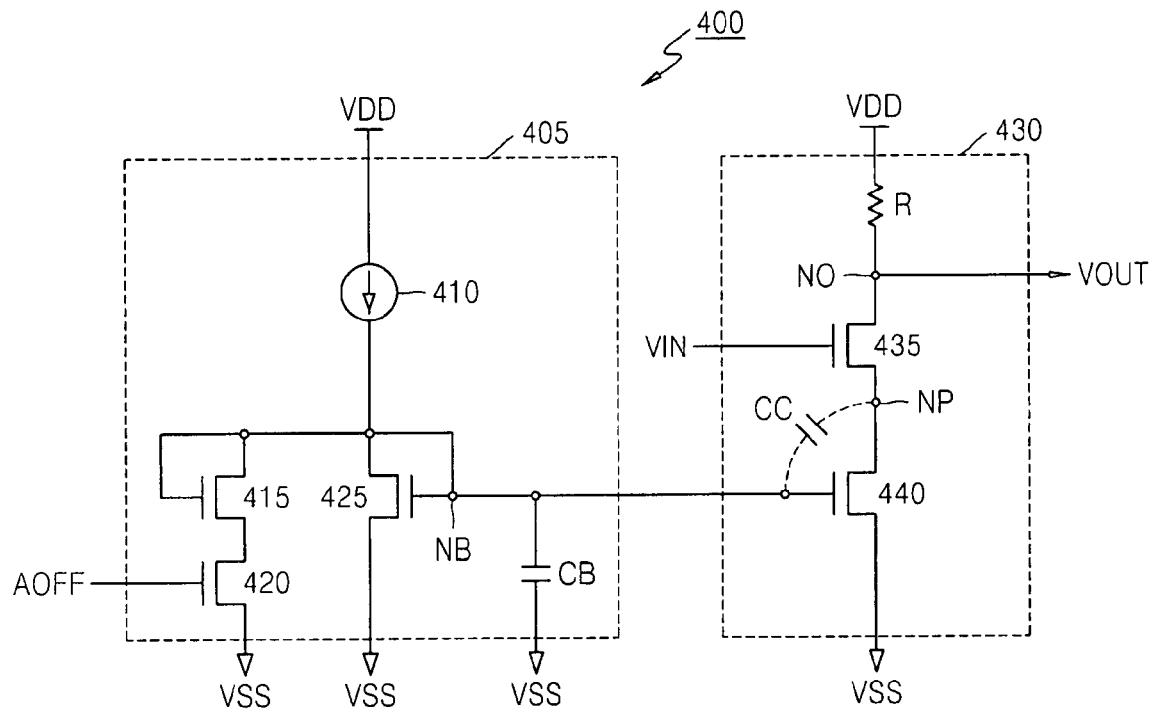
FIG. 8 is a circuit diagram of an embodiment of a single ended amplifier circuit according to another aspect of the present invention.

FIG. 8 is a circuit diagram of an embodiment of a single ended amplifier circuit 400 according to another aspect of the present invention.

Referring to FIG. 8, the single ended amplifier circuit 400 includes a bias circuit (or a bias voltage generating circuit) 405 and a single ended amplifier 430. The single ended amplifier circuit 400 can be, for example, a data output diver of a semiconductor memory device.

The bias circuit 405 includes a current source 410, first, second, and third NMOS transistors 415, 420, and 425, and a bias capacitor CB.

The current source 410 includes a terminal connected to a source voltage VDD and provides a current to a bias node NB. The bias node NB is connected to a gate of a pull-down transistor 440 of the single ended amplifier 430.

The first NMOS transistor 415 has a diode configuration and performs as a voltage source transistor. The first NMOS transistor 415 includes a drain and a gate respectively connected to the bias node NB.

The second NMOS transistor 420 performs as a switch transistor. The second NMOS transistor 420 includes a drain connected to a source of the first NMOS transistor 415, a gate to which a bias control signal AOFF is input from an external device, and a source connected to a ground voltage VSS. The bias control signal AOFF can be activated to a logic high level when the single ended amplifier circuit 400 (or the single ended amplifier 430) is turned off and be deactivated to a logic low level when the single ended amplifier circuit 400 (or the single ended amplifier 430) is turned on.

The third NMOS transistor 425 has a diode configuration and performs as a voltage source transistor. The third NMOS transistor 425 includes a drain and a gate respectively connected to the bias node NB, and a source connected to the ground voltage VSS.

The bias capacitor CB substantially prevents bias voltage noise from being generated in the bias node NB. A terminal of the bias capacitor CB is connected to the bias node NB and another terminal of the bias capacitor CB is connected to the ground voltage VSS.

The single ended amplifier 430 includes a load resistor R, an input transistor 435 which receives an input voltage VIN, and a pull-down transistor 440 connected to the input transistor 435 through a pull-down node NP. The input transistor 435 can be, for example, an NMOS transistor.

The load resistor R is connected between first voltage, which is the source voltage VDD, and the input transistor 435.

The pull-down transistor 440 is connected between the input transistor 435 and a second voltage, which is the ground voltage VSS, and provides a pull-down current to the input transistor 435 and the load resistor R. The pull-down transistor 440 is a bias transistor, which can be an NMOS transistor, and performs as a current source transistor.

The bias circuit 405 provides a substantially constant first bias voltage to a gate of the pull-down transistor 440 included in the single ended amplifier 430 through the bias node NB when the single ended amplifier 430 (or the single ended amplifier circuit 400) is turned on. The bias circuit 405 also provides a second bias voltage, which is lower than the first bias voltage, to the gate of the pull-down transistor 440 included in the single ended amplifier 430 through the bias node NB when the single ended amplifier 430 (or the single ended amplifier circuit 400) is turned off. The first bias voltage is required for the single ended amplifier circuit 400 to perform the turn-on operation appropriately and is substantially equal to the voltage VB1 of FIG. 2.

The single ended amplifier 430 generates an output voltage VOUT though an output node NO by amplifying a voltage corresponding to the input voltages VIN. A level of the input voltage VIN input to the input transistor 435 of the single ended amplifier 430 can swing between the source voltage VDD and the ground voltage VSS.

A turn-off operation of the single ended amplifier circuit 400 will now be described below. The turn-off operation of the single ended amplifier circuit 400 corresponds to a case when the input voltage VIN is deactivated to a logic low level (for example, the ground voltage VSS). When the single ended amplifier circuit 400 performs the turn-off operation, the output voltage VOUT is at a logic high level.

Since the input voltage VIN is deactivated to a logic low level, the second NMOS transistor 420 of the bias circuit 405 is turned on in response to the bias control signal AOFF at a logic high level. Accordingly, a pull-down current flows through both the first NMOS transistor 415 and the third NMOS transistor 425 from the bias node NB to the ground voltage VSS. Therefore, the second bias voltage, which is the voltage of the bias node NB when the single ended amplifier circuit 400 is turned off, is lower than the first bias voltage, which is the voltage of the bias node NB after the single ended amplifier circuit 400 is turned on.

A turn-on operation of the single ended amplifier circuit 400 will now be described below. The turn-on operation of the single ended amplifier circuit 400 corresponds to a case when the input voltage VIN is activated from a logic low level (for example, the ground voltage VSS) to a logic high level (for example, the source voltage VDD). When the single ended amplifier circuit 400 performs the turn-on operation, the input transistor 435 is turned on by the input voltage VIN at a logic high level. Accordingly, the output voltage VOUT of the output node NO is at a logic low level.

Since the input voltage VIN transitions from a logic low level to a logic high level, the second NMOS transistor 420 of the bias circuit 405 is turned off in response to the bias control signal AOFF at a logic low level. Accordingly, no current flows through the first NMOS transistor 415 and a pull-down current flows only through the third NMOS transistor 425 from the bias node NB to the ground voltage VSS. As a result, the voltage of the bias node NB after the single ended amplifier circuit 400 is turned on is substantially the first bias voltage.

The initial operation of the turn-on operation of the single ended amplifier circuit 400, that is an operation when the input voltage VIN transitions from a logic low level to a logic high level, will now be described below. The pull-down transistor 440 pulls down the voltage of the pull-down node NP to the ground voltage VSS in response to the second bias voltage. In this case, the input transistor 435 is turned on by the input voltage VIN at a logic high level and a current is provided to the pull-down node NP through the load resistor R such that a voltage of the pull-down node NP can be higher than the ground voltage VSS. The voltage of the pull-down node NP can increase the voltage of the bias node NB by a parasitic coupling capacitance CC between the pull-down node NP and the bias node NB. However, since the voltage of the bias node NB in the initial turn-on operation of the single ended amplifier circuit 400 is set as the second bias voltage, which is a relatively low voltage, the voltage of the bias node NB is not increased higher than the first bias voltage, even though kick-back noise is generated by the parasitic coupling capacitance CC. That is, the effect of the kick-back noise on the voltage of the bias node NB can be reduced. Accordingly, a high current does not flow through the pull-down transistor 440 due to the kick-back noise.

Since the single ended amplifier circuit 400 can set a bias voltage when the single ended amplifier 430 is turned off lower than the bias voltage when the single ended amplifier 430 is turned on, the current which flows through the pull-down transistor 440 due to the kick-back noise can be reduced. Accordingly, the single ended amplifier circuit 400 can also reduce power consumption. Also, since the single ended amplifier circuit 400 can set the bias voltage when the single ended amplifier 430 is turned off to be lower than the bias voltage when the single ended amplifier 430 is turned on, the effect of the kick-back noise on the voltage of the bias node NB can be reduced. As a result, the voltage of the bias node NB when the single ended amplifier 430 is turned on can be maintained substantially constant such that noise, such as a swing range change of the output voltage VOUT, can be reduced.

Figure 9:
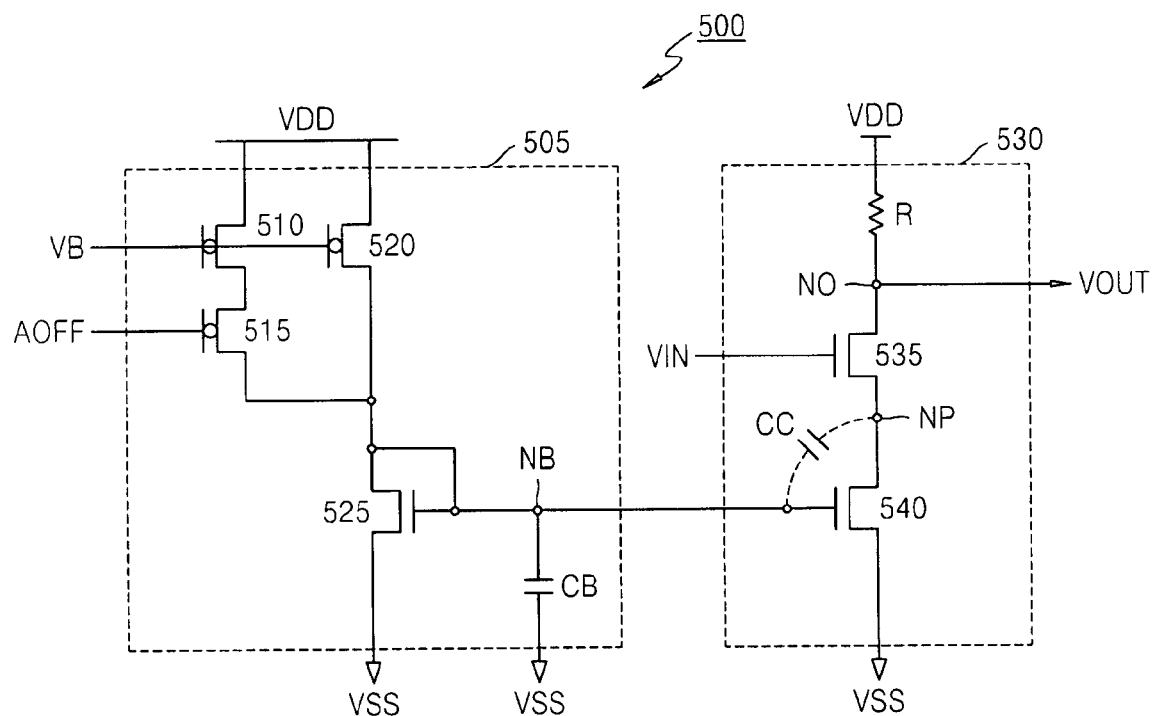
FIG. 9 is a circuit diagram of another embodiment of a single ended amplifier circuit according to another aspect of the present invention.

FIG. 9 is a circuit diagram of an embodiment of a single ended amplifier circuit 500 according to another aspect of the present invention.

Referring to FIG. 9, the single ended amplifier circuit 500 includes a bias circuit (or a bias voltage generating circuit) 505 and a single ended amplifier 530. The single ended amplifier circuit 500 can be, for example, a data output diver of a semiconductor memory device.

The bias circuit 505 includes first, second, and third PMOS transistors 510, 515, and 520, an NMOS transistor 525, and a bias capacitor CB.

The first PMOS transistor 510 performs as a current source transistor. The first PMOS transistor 510 includes a source connected to a source voltage VDD and a gate connected to a bias voltage VB.

The second PMOS transistor 515 performs as a switch transistor. The second PMOS transistor 515 includes a source connected to a drain of the first PMOS transistor 510, and a gate to which a bias control signal AOFF is input from an external device. The bias control signal AOFF can be activated to a logic high level when the single ended amplifier circuit 500 (or the single ended amplifier 530) is turned off and be deactivated to a logic low level when the single ended amplifier circuit 500 (or the single ended amplifier 530) is turned on.

The third PMOS transistor 520 performs as a current source transistor. The third PMOS transistor 520 includes a source connected to the source voltage VDD, a gate connected to the bias voltage VB, and a drain connected to the drain of the second PMOS transistor 515 and a gate of a pull-down transistor 540 of the single ended amplifier 530.

The NMOS transistor 525 has a diode configuration and performs as a voltage source transistor. The NMOS transistor 525 includes a drain and a gate respectively connected to a bias node NB, and a source connected to the ground voltage VSS. The bias node NB is connected to the gate of the pull-down transistor 540.

The bias capacitor CB prevents bias voltage noise from being generated in the bias node NB. A terminal of the bias capacitor CB is connected to the bias node NB and another terminal of the bias capacitor CB is connected to the ground voltage VSS.

The single ended amplifier 530 includes a load resistor R, an input transistor 535 which receives an input voltage VIN, and the pull-down transistor 540 connected to the input transistor 535 through a pull-down node NP. The input transistor 535 can be, for example, an NMOS transistor.

The load resistor R is connected between a first voltage, which is the source voltage VDD, and the input transistor 535.

The pull-down transistor 540 is connected between the input transistor 535 and a second voltage, which is the ground voltage VSS, and provides a pull-down current to the input transistor 535 and the load resistor R. The pull-down transistor 540 is a bias transistor, which can be an NMOS transistor, and performs as a current source transistor.

The bias circuit 505 provides a substantially constant first bias voltage to the gate of the pull-down transistor 540 included in the single ended amplifier 530 through the bias node NB when the single ended amplifier 530 (or the single ended amplifier circuit 500) is turned on. The bias circuit 505 also provides a second bias voltage which is lower than the first bias voltage to the gate of the pull-down transistor 540 included in the single ended amplifier 530 through the bias node NB when the single ended amplifier 530 (or the single ended amplifier circuit 500) is turned off. The first bias voltage is required for the single ended amplifier circuit 500 to perform the turn-on operation appropriately and is substantially equal to the voltage VB1 of FIG. 2.

The single ended amplifier 530 generates an output voltage VOUT through an output node NO by amplifying a voltage corresponding to the input voltage VIN. A level of the input voltage VIN input to the input transistor 535 of the single ended amplifier 530 can swing between the source voltage VDD and the ground voltage VSS.

A turn-off operation of the single ended amplifier circuit 500 will now be described below. The turn-off operation of the single ended amplifier circuit 500 corresponds to a case when the input voltage VIN is deactivated to a logic low level (for example, the ground voltage VSS). When the single ended amplifier circuit 500 performs the turn-off operation, the output voltage VOUT is at a logic high level.

Since the input voltage VIN is deactivated to a logic low level, the second PMOS transistor 515 of the bias circuit 505 is turned off in response to the bias control signal AOFF at a logic high level. Accordingly, no current flows through the first PMOS transistor 510 and a current flows only through the third PMOS transistor 520 to the bias node NB. Therefore, the second bias voltage, which is voltage of the bias node NB when the single ended amplifier circuit 500 is turned off, is lower than the first bias voltage, which is voltage of the bias node NB after the single ended amplifier circuit 500 is turned on.

A turn-on operation of the single ended amplifier circuit 500 will now be described below. The turn-on operation of the single ended amplifier circuit 500 corresponds to a case when the input voltage VIN is activated from a logic low level (for example, the ground voltage VSS) to a logic high level (for example, the source voltage VDD). When the single ended amplifier circuit 500 performs the turn-on operation, the input transistor 535 is turned on by the input voltage VIN at a logic high level. Accordingly, the output voltage VOUT of the output node NO is at a logic low level.

Since the input voltage VIN transitions from a logic low level to a logic high level, the second PMOS transistor 515 of the bias circuit 505 is turned on in response to the bias control signal AOFF at a logic low level. Accordingly, current flows through both the first PMOS transistor 510 and the third PMOS transistor 520 to the bias node NB. As a result, a voltage of the bias node NB after the single ended amplifier circuit 500 is turned on is substantially the first bias voltage.

The initial operation of the turn-on operation of the single ended amplifier circuit 500, that is an operation when the input voltage VIN transitions from a logic low level to a logic high level, will now be described below. The pull-down transistor 540 pulls down a voltage of the pull-down node NP to the ground voltage VSS in response to the second bias voltage. In this case, the input transistor 535 is turned on by the input voltage VIN at a logic high level and a current is provided to the pull-down node NP through the load resistor R such that the voltage of the pull-down node NP can be higher than the ground voltage VSS. The voltage of the pull-down node NP can increase the voltage of the bias node NB by a parasitic coupling capacitance CC between the pull-down node NP and the bias node NB. However, since the voltage of the bias node NB in the initial turn-on operation of the single ended amplifier circuit 500 is set as the second bias voltage, which is a relatively low voltage, the voltage of the bias node NB is not be increased higher than the first bias voltage, even though kick-back noise is generated by the parasitic coupling capacitance CC. That is, the effect of the kick-back noise on the voltage of the bias node NB can be reduced. Accordingly, a high current does not flow through the pull-down transistor 540 due to the kick-back noise.

Since the single ended amplifier circuit 500 of FIG. 9 can set the bias voltage when the single ended amplifier 530 is turned off to be lower than the bias voltage when the single ended amplifier 530 is turned on, the current flowing through the pull-down transistor 540 due to the kick-back noise can be reduced. Accordingly, the single ended amplifier circuit 500 can also reduce power consumption. Also, since the single ended amplifier circuit 500 can set the bias voltage when the single ended amplifier 530 is turned off to be lower than the bias voltage when the single ended amplifier 530 is turned on, the effect of the kick-back noise on the voltage of the bias node NB can be reduced. As a result, the voltage of the bias node NB when the single ended amplifier 530 is turned on can be maintained substantially constant such that noise, such as a swing range change of the output voltage VOUT, can be reduced.

As described above, an amplifier circuit and a method of generating bias voltage in the amplifier circuit according to the present invention can set the bias voltage when an amplifier is turned off to be lower than the bias voltage when the amplifier is turned on, thereby limiting a current flowing through a pull-down transistor due to the kick-back noise. Accordingly, the amplifier circuit and the method of generating bias voltages in the amplifier circuit according to the present invention can reduce power consumption. Also, the amplifier circuit and the method of generating bias voltage in the amplifier circuit according to the present invention can set the bias voltage when the amplifier is turned off to be lower than the bias voltage when the amplifier is turned on, thereby reducing the effect of the kick-back noise on the voltage of a bias node. As a result, the voltage of the bias node when the amplifier is turned on can be maintained substantially constant such that noise, such as a swing range change of the output voltage, can be reduced.

While the present invention has been particularly shown and described with reference to exemplary embodiments thereof, it will be understood by those of ordinary skill in the art that various changes in form and details can be made therein without departing from the spirit and scope of the present invention as defined by the following claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A differential amplifier circuit which is configured to be turned on or turned off in response to an input voltage to be amplified, the differential amplifier circuit comprising:

a differential amplifier including a pull-down transistor; and a bias circuit configured to provide a first bias voltage to a gate of the pull-down transistor when the differential amplifier is turned on and is also configured to provide a second bias voltage which is lower than the first bias voltage to the gate of the pull-down transistor when the differential amplifier is turned off.

2. The differential amplifier circuit of claim 1, wherein the bias circuit comprises:
a current source configured to provide a current to a bias node connected to the gate of the pull-down transistor;
a first NMOS transistor comprising a drain and a gate each connected to the bias node;
a second NMOS transistor comprising a drain connected to a source of the first NMOS transistor, a gate configured to receive a bias control signal, which is activated to a logic high level when the differential amplifier is turned off and a source connected to a ground voltage; and
a third NMOS transistor comprising a drain and a gate each connected to the bias node, and a source connected to the ground voltage.

3. The differential amplifier circuit of claim 2, wherein the bias circuit further comprises a bias capacitor comprising a terminal connected to the bias node and another terminal connected to the ground voltage.

4. The differential amplifier circuit of claim 1, wherein the bias circuit comprises:
a first PMOS transistor comprising a source connected to a source voltage and a gate connected to a bias voltage;
a second PMOS transistor comprising a source connected to a drain of the first PMOS transistor and a gate configured to receive a bias control signal, which is activated to a logic high level when the differential amplifier is turned off;
a third PMOS transistor comprising a source connected to the source voltage, a gate connected to the bias voltage, and a drain connected to a drain of the second PMOS transistor and the gate of the pull-down transistor; and
an NMOS transistor comprising a drain and a gate each connected to a bias node NB which is connected to the gate of the pull-down transistor, and a source connected to a ground voltage.

5. The differential amplifier circuit of claim 4, wherein the bias circuit further comprises a bias capacitor comprising a terminal connected to the bias node and another terminal connected to the ground voltage.

6. The differential amplifier circuit of claim 1, wherein the differential amplifier further comprises a plurality of input transistors each configured to receive a first input voltage activated when the differential amplifier is turned on and a second input voltage deactivated when the differential amplifier is turned on, wherein the input transistors are connected to the pull-down transistor through a common node.

7. The differential amplifier circuit of claim 1, wherein the pull-down transistor is configured to pull down an output voltage of the differential amplifier to a logic low level when the differential amplifier is turned on.

8. A differential amplifier circuit comprising:
first and second input transistors each configured to receive first and second input voltages;
first and second load resistors each connected between each of the first and second input transistors, and a first voltage;
a pull-down transistor connected between the first and second input transistors, and a second voltage, and configured to provide a pull-down current to the first input transistor and the first load resistor; and
a bias circuit configured to provide a first bias voltage to a gate of the pull-down transistor when the first input voltage is activated and the second input voltage is deactivated, and configured to provide a second bias voltage which is lower than the first bias voltage to the gate of the pull-down transistor when the first input voltage and the second input voltage are deactivated.

9. The differential amplifier circuit of claim 8, wherein the first voltage is a source voltage and the second voltage is a ground voltage.

10. A single ended amplifier circuit configured to be turned on or turned off in response to an input voltage to be amplified, the single ended amplifier circuit comprising:
a single ended amplifier; and
a bias circuit configured to provide a first bias voltage to a gate of a pull-down transistor included in the single ended amplifier when the single ended amplifier is turned on and to provide a second bias voltage which is lower than the first bias voltage to the gate of the pull-down transistor when the single ended amplifier is turned off.

11. The single ended amplifier circuit of claim 10, wherein the bias circuit comprises:
a current source configured to provide a current to a bias node connected to the gate of the pull-down transistor;
a first NMOS transistor comprising a drain and a gate each connected to the bias node;
a second NMOS transistor comprising a drain connected to a source of the first NMOS transistor, a gate configured to receive a bias control signal, which is activated to a logic high level when the single ended amplifier is turned off, and a source connected to a ground voltage; and
a third NMOS transistor comprising a drain and a gate each connected to the bias node, and a source connected to the ground voltage.

12. The single ended amplifier circuit of claim 11, wherein the bias circuit further comprises a bias capacitor comprising a terminal connected to the bias node and another terminal connected to the ground voltage.

13. The single ended amplifier circuit of claim 10, wherein the bias circuit comprises:
a first PMOS transistor comprising a source connected to a source voltage and a gate connected to a bias voltage;
a second PMOS transistor comprising a source connected to a drain of the first PMOS transistor and a gate configured to receive a bias control signal, which is activated to a logic high level when the single ended amplifier is turned off;
a third PMOS transistor comprising a source connected to the source voltage, a gate connected to the bias voltage, and a drain connected to a drain of the second PMOS transistor and the gate of the pull-down transistor; and
an NMOS transistor comprising a drain and a gate each connected to a bias node NB which is connected to the gate of the pull-down transistor, and a source connected to a ground voltage.

14. The single ended amplifier circuit of claim 13, wherein the bias circuit further comprises a bias capacitor comprising a terminal connected to the bias node and another terminal connected to the ground voltage.

15. The single ended amplifier circuit of claim 10, wherein the single ended amplifier further comprises an input transistor configured to receive the input voltage activated when the single ended amplifier is turned on, and the input transistor is connected to the pull-down transistor through a pull-down node.

16. The single ended amplifier circuit of claim 10, wherein the pull-down transistor is configured to pull down an output voltage of the single ended amplifier to a logic low level when the single ended amplifier is turned on.

17. A single ended amplifier circuit comprising:

an input transistor configured to receive an input voltage;

a load resistor connected between the input transistor and a first voltage;

a pull-down transistor connected between the input transistor and a second voltage, and configured to provide a pull-down current to the input transistor and the load resistor; and a bias circuit configured to provide a first bias voltage to a gate of the pull-down transistor when the input voltage is activated, and to provide a second bias voltage which is lower than the first bias voltage to the gate of the pull-down transistor when the input voltage is deactivated.

18. The single ended amplifier circuit of claim 17, wherein the first voltage is a source voltage and the second voltage is a ground voltage.

19. A method of generating a bias voltage in a differential amplifier circuit configured to be turned on or turned off in response to an input voltage to be amplified, the method comprising:

generating and providing a first bias voltage to a gate of a pull-down transistor included in a differential amplifier of the differential amplifier circuit when the differential amplifier is turned on; and generating and providing a second bias voltage which is lower than the first bias voltage to the gate of the pull-down transistor when the differential amplifier is turned off.

20. A method of generating a bias voltage in a single ended amplifier circuit which is turned on or turned off in response to an input voltage to be amplified, the method comprising:

generating and providing a first bias voltage to a gate of a pull-down transistor included in a single ended amplifier of the single ended amplifier circuit when the single ended amplifier is turned on; and generating and providing a second bias voltage which is lower than the first bias voltage to the gate of the pull-down transistor when the single ended amplifier is turned off.

* * * * *